United States Patent
Baskett

Patent Number: 5,132,559
Date of Patent: Jul. 21, 1992

[54] CIRCUIT FOR TRIMMING INPUT OFFSET VOLTAGE UTILIZING VARIABLE RESISTORS

[75] Inventor: Ira E. Baskett, Tempe, Ariz.

[73] Assignee: Motorola, Inc., Schaumburg, Ill.

[21] Appl. No.: 695,151

[22] Filed: May 3, 1991

[51] Int. Cl.⁵ ............................................. H03K 5/22
[52] U.S. Cl. .................................... 307/355; 307/491; 307/299.3
[58] Field of Search ............... 307/491, 494, 299.3, 307/355, 360, 362; 330/261, 257

[56] References Cited

U.S. PATENT DOCUMENTS

| | | | |
|---|---|---|---|
| 4,050,030 | 9/1977 | Russell | 330/256 |
| 4,258,330 | 3/1981 | Kanedo et al. | 307/299.3 |
| 4,406,955 | 9/1983 | Lo Cascio | 307/355 |
| 4,418,290 | 11/1983 | Nagano | 307/355 |
| 4,462,002 | 7/1984 | Schade, Jr. | 330/257 |
| 4,464,631 | 8/1984 | Prentice | 330/253 |
| 4,568,840 | 2/1986 | Kenji | 330/257 |
| 4,577,121 | 3/1986 | Sano et al. | 307/355 |
| 4,902,984 | 2/1990 | Vinn et al. | 330/257 |

*Primary Examiner*—Stanley D. Miller
*Assistant Examiner*—Toan Tran
*Attorney, Agent, or Firm*—Bradley J. Botsch

[57] ABSTRACT

A circuit for trimming the input offset voltage of an input stage of an op amp includes variable resistors (20, 24) for providing variable voltages in series with the input voltage of the op amp. The voltage drop across the variable resistors is adjusted to compensate for any base-emitter voltage mismatches of the input transistors (12, 14) thereby making the input offset voltage of the op amp equal to zero. Further, the variable resistors can be replaced by resistive networks (40, 42) such that the resistive networks can be adjusted to provide an input stage with a zero temperature coefficient as well as a zero input offset voltage.

17 Claims, 2 Drawing Sheets

CIRCUIT FOR TRIMMING INPUT OFFSET VOLTAGE UTILIZING VARIABLE RESISTORS

BACKGROUND OF THE INVENTION

This invention relates to circuits, such as a circuit for trimming input offset voltage.

The input offset voltage of an operational amplifier (op amp) can be defined as the potential that must be applied between the input terminals of the op amp to provide a zero output. Thus, an op amp having a predetermined input offset voltage causes a non-zero output to occur when the voltage applied between the input terminals of the op amp are equal. Further, the input offset voltage is typically due to base-emitter voltage mismatches between input transistors of the op amp. In addition, the input offset voltage error is typically gained up through the later stages of the op amp thereby creating an even greater offset voltage error.

One attempt to minimize the input offset voltage of an op amp is to design a precision op amp having cross coupled transistors and perfectly matched circuit blocks. However, precision op amps consume a large amount of die area and are expensive to build.

Hence, there exists a need for an improved circuit to trim the input offset voltage of an op amp.

SUMMARY OF THE INVENTION

Briefly, there is provided a circuit comprising an input circuit for receiving first and second input voltages and having first and second outputs; a differential amplifier circuit having first and second inputs and first and second outputs; a first resistive network coupled between the first output of the input circuit and the first input of the differential amplifier circuit; and a second resistive network coupled between the second output of the input circuit and the second input of the differential amplifier circuit, the first and second resistive networks being adjusted such that when the first and second input voltages are substantially equal the currents at the first and second outputs of the differential amplifier circuit are substantially equal.

DETAILED DESCRIPTION OF THE DRAWINGS

Figure 1:
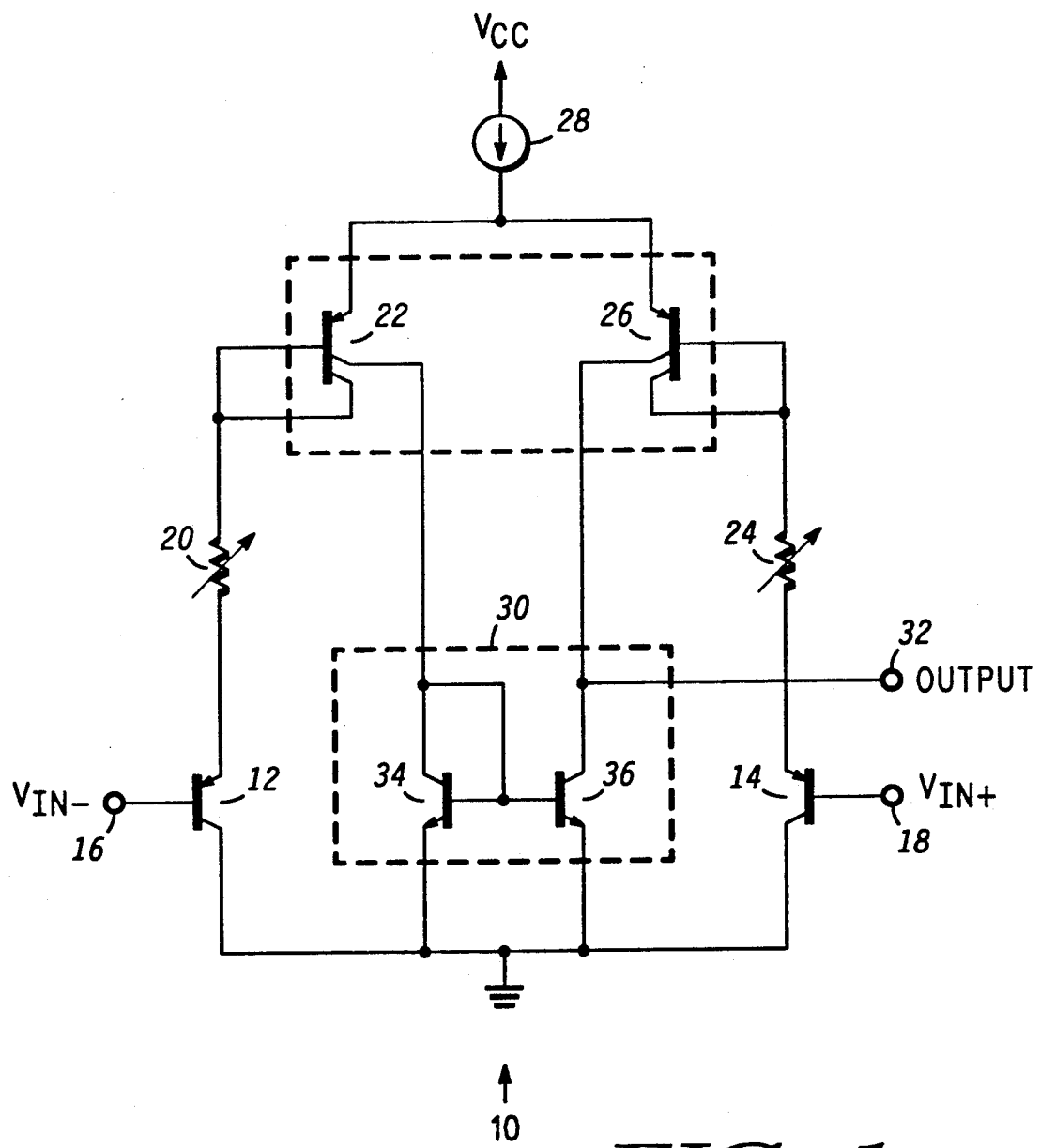
FIG. 1 is a detailed schematic diagram illustrating a first embodiment in accordance with the present invention.

Referring to FIG. 1, a detailed schematic diagram illustrating input stage 10 of an op amp is shown comprising input transistors 12 and 14 each having a collector returned to ground. The base of transistor 12 is coupled to terminal 16 at which voltage $V_{IN}-$ is applied, and the base of transistor 14 is coupled to terminal 18 at which the voltage $V_{IN}+$ is applied.

The emitter of transistor 12 is coupled to a first terminal of variable resistor 20 whose second terminal is coupled to the base of multi-collector transistor 22. Likewise, the emitter of transistor 14 is coupled to a first terminal of variable resistor 24 whose second terminal is coupled to the base of multi-collector transistor 26. The emitters of transistors 22 and 26 are coupled through current source 28 to operating potential $V_{CC}$.

The first collector of transistor 22 is coupled to the base of transistor 22, while the second collector of transistor 22 is coupled to the input of current mirror 30. Likewise, the first collector of transistor 26 is coupled to the base of transistor 26, while the second collector of transistor 26 is coupled to the output of current mirror 30. The second collector of transistor 26 is also coupled to terminal 32 at which signal OUTPUT is provided.

Current mirror 30 includes transistor 34 having a base and a collector coupled to the input of current mirror 30 and an emitter returned to ground Transistor 36 has a collector coupled to the output of current mirror 30, and a base coupled to the base of transistor 34. Further, the emitter of transistor 36 is returned to ground.

In operation, if the voltage applied at terminal 16 is less than the voltage applied at terminal 18, a greater amount of current flows through multi-collector transistor 22 than through multi-collector transistor 26. Hence, a greater current flows at the input of current mirror 30 than at the output of current mirror 30. As a result, additonal current must be pulled from terminal 32 to the output of current mirror 30 to satisfy the current requirement of current mirror 30.

On the other hand, if the voltage applied at terminal 16 is greater than the voltage applied at terminal 18, a lesser amount of current flows through multi-collector transistor 22 than through multi-collector transistor 26. Thus, a lesser current flows at the input of current mirror 30 than at the output of current mirror 30. As a result, additional current is supplied to terminal 32 in order to satisfy the current requirements of current mirror 30.

Also, under the assumption that no input offset voltage exists within input stage 10, if the voltage applied at terminal 16 is substantially equal to the voltage applied at terminal 18, then the current flowing through multi-collector transistor 22 is substantially equal to the current flowing through multi-collector transistor 26. As a result, the current flowing through the input of current mirror 30 is substantially equal to the current flowing to the output of current mirror 30 (assuming no errors in current mirror 30). Hence, the current flowing at terminal 32 is substantially equal to zero.

On the other hand, if there exists an input offset voltage, for example, the base-emitter voltage of transistor 12 is not equal to the base-emitter voltage of transistor 14, then even if the voltage applied at terminal 16 is substantially equal to the voltage applied at terminal 18, the current flowing at terminal 32 will not be equal to zero. This is due to the fact that unequal currents flow through transistors 22 and 26 since unequal voltages are applied to the bases of transistors 22 and 26.

However, variable resistors 20 and 24 may be adjusted to ensure that equal currents flow through transistors 22 and 26. In other words, variable resistors 20 and 24 are adjusted to compensate for any mismatches between the base-emitter voltages of transistors 12 and 14 as well as the base-emitter voltages of transistors 22 and 26. In general, it should be realized that variable resistors 20 and 24 can be adjusted to compensate for any mismatches within input stage 10 such that equal currents are provided at the second collectors of transistors 22 and 26 thereby providing a zero input offset voltage of input stage 10.

Variable resistors 20 and 24 generate variable voltages in series with input voltages $V_{IN-}$ and $V_{IN+}$, respectively, such that equal currents flow through the second collectors of transistors 22 and 26. Further, it is understood that equal currents also flow through the first collectors of transistors 22 and 26. In addition, it is worth noting that the ratio of current between the first and second collectors of multi-collector transistor 22 and the ratio of current between the first and second collectors of multi-collector transistor 26 is not restricted to unity. Moreover, if there exists any mismatch between the first and second collector ratio of transistor 22 with respect to the first and second collector ratio of transistor 26, then resistors 20 and 24 can be adjusted accordingly to compensate for the mismatch.

In summary, resistors 20 and 24 are adjusted such that the current flowing through the second collector of transistor 22 is substantially equal to the current flowing through the second collector of transistor 26. In this manner, substantially equal currents flow at the input and output of current mirror 30 and zero current flows at terminal 32. Thus, the input offset voltage of input stage 10 is substantially equal to zero.

As an example, suppose that an input offset voltage of input stage 10 exists such that a potential of 2 millivolts must be applied to terminal 16 with respect to terminal 18 in order to create a zero output at terminal 32. This means that if resistor 24 is made slightly larger than resistor 20 such that the voltage drop across resistor 24 is 2 millivolts higher than the voltage drop across resistor 20, then equal currents will flow through the second collectors of transistors 22 and 26, and the current flowing at terminal 32 will be equal to zero. Thus, the input offset voltage of 2 millivolts has been trimmed to zero.

It is worth noting that the present invention can be used to match op amp pairs wherein matching op amp pairs does not require the input offset voltage of each op amp to be equal to zero, but that the input offset voltage of each op amp be equal to each other.

Figure 2:
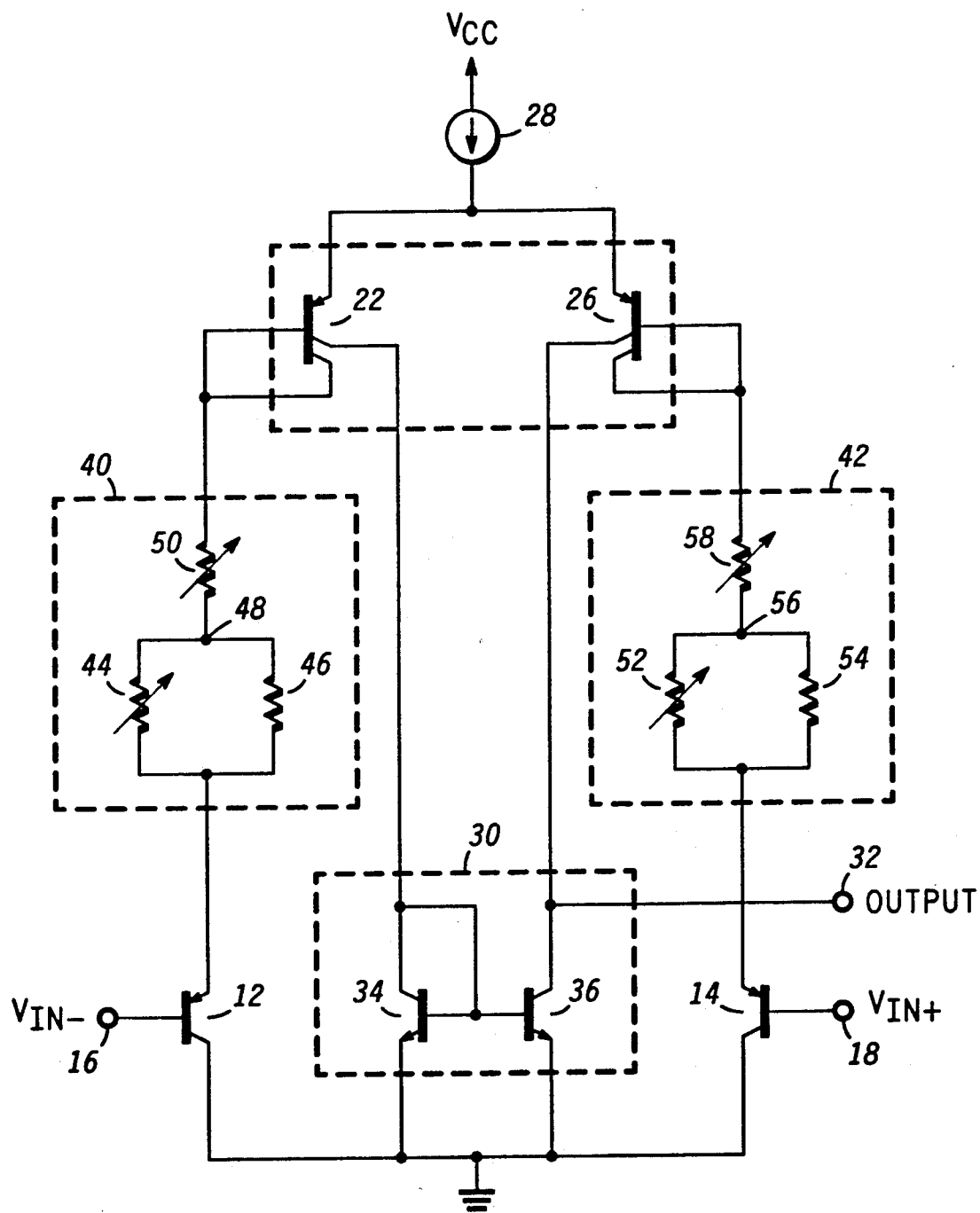
FIG. 2 is a detailed schematic diagram illustrating a second embodiment in accordance with the present invention.

Referring to FIG. 2, a detailed schematic diagram illustrating a second embodiment of an input stage of an op amp is shown. It is understood that components shown in FIG. 2 which are identical to components shown in FIG. 1 are identified by the same reference numbers. The circuit of FIG. 2 replaces variable resistors 20 and 24 of FIG. 1 with resistive networks 40 and 42 in order to provide temperature compensation as well as the aforedescribed input offset voltage compensation.

Resistive network 40 includes parallel coupled resistors 44 and 46 each having a first terminal coupled to the emitter of transistor 12, and a second terminal coupled to circuit node 48. Resistive network 40 also includes resistor 50 coupled between circuit node 48 and the base of transistor 22.

Similarly, resistive network 42 includes parallel coupled resistors 52 and 54 each having a first terminal coupled to the emitter of transistor 14, and a second terminal coupled to circuit node 56. Resistive network 42 also includes resistor 58 coupled between circuit node 56 and the base of transistor 26.

By varying the values of variable resistors 44 and 50, and 52 and 58 respectively of resistive networks 40 and 42, the temperature coefficient of the input stage can be adjusted to zero. As an example, suppose that resistors 44 and 50 of resistive network 40 are chrome-silicon resistors and, thus, have a zero temperature coefficient. Further, suppose resistor 46 is a P-type resistor having a predetermined temperature coefficient. If the value of resistor 44 is increased, then the temperature coefficient of resistive network 40 will increase since an increased current flows through resistor 46.

However, if the value of resistor 50 is increased, then the temperature coefficient of resistive network 40 will decrease since a decreased current flows through resistive network 40. Likewise, it is understood that the temperature coefficient of resistive network 42 can be adjusted in a similar manner.

In addition, by varying the values of resistors 44 and 50, and resistors 52 and 58, the effective resistance of resistive networks 40 and 42, respectively, can be adjusted such that the current flowing through the second collector of transistor 22 is substantially equal to the current flowing through the second collector of transistor 26, as aforedescribed for resistors 20 and 24 of FIG. 1.

The above example has been illustrated by using chrome-silicon and P-type resistors. However, it should be realized that resistive networks 40 and 42 can include any type of resistor such as: thin film laser trim resistors; polysilicon current pulse trim resistors; metal migration trim resistors; N-type resistors; and potentiometers.

By now it should be apparent from the foregoing discussion that a novel circuit has been provided for trimming the input offset voltage of an input stage of an op amp while still maintaining a zero temperature coefficient. Further, the present invention is illustrated utilizing an input stage of an operational amplifier. However, it should be apparent that the present invention can be used with any circuit to provide substantially equal currents at the outputs of a differential amplifier circuit.

I claim:

1. A circuit, comprising:

input means for receiving first and second input voltages and having first and second outputs;

differential amplifier means having first and second inputs and first and second outputs, said differential amplifier means including:

a first multi-collector transistor having a base, an emitter and first and second collectors, said base of said first multi-collector transistor being coupled to said first input of said differential amplifier means, said first collector of said first multi-collector transistor being coupled to said base of said first multi-collector transistor, said second collector of said first multi-collector transistor being coupled to said first output of said differential amplifier means;

a second multi-collector transistor having a base, an emitter and first and second collectors, said base of said second multi-collector transistor being coupled to said second input of said differential amplifier means, said first collector of said second multi-collector transistor being coupled to said base of said second multi-collector transistor, said second collector of said second multi-collector transistor being coupled to said second output of said differential amplifier means, said emitter of said second multi-collector transistor being coupled to said emitter of said first multi-collector transistor; and a current source coupled between a first supply voltage terminal and said emitters of said first and second multi-collector transistors;

a first adjustable resistive network coupled in series between said first output of said input means and said first input of said differential amplifier means; and a second adjustable resistive network coupled in series between said second output of said input means and said second input of said differential amplifier means, said first and second resistive networks being adjusted such that when said first and second input voltages are substantially equal currents appearing at said first and second outputs of said differential amplifier means are substantially equal.

2. The circuit according to claim 1 wherein said differential amplifier means includes:

a first multi-collector transistor having a base, an emitter and first and second collectors, said base of said first multi-collector transistor being coupled to said first input of said differential amplifier means, said first collector of said first multi-collector transistor being coupled to said base of said first multi-collector transistor, said second collector of said first multi-collector transistor being coupled to said first output of said differential amplifier means;

a second multi-collector transistor having a base, an emitter and first and second collectors, said base of said second multi-collector transistor being coupled to said second input of said differential amplifier means, said first collector of said second multi-collector transistor being coupled to said base of said second multi-collector transistor, said second collector of said second multi-collector transistor being coupled to said second output of said differential amplifier means, said emitter of said second multi-collector transistor being coupled to said emitter of said first multi-collector transistor; and a current source coupled between a first supply voltage terminal and said emitters of said first and second multi-collector transistors.

3. The circuit according to claim 2 wherein said input means includes:

a first transistor having a collector, a base and an emitter, said collector of said first transistor being coupled to a second supply voltage terminal, said base of said transistor being coupled to receive said first input voltage, and said emitter of said first transistor being coupled to said first output of said input means; and a second transistor having a collector, a base and an emitter, said collector of said second transistor being coupled to said second supply voltage terminal, said base of said second transistor being coupled to receive said second input voltage, and said emitter of said second transistor being coupled to said second output of said input means.

4. The circuit according to claim 3 wherein said first resistive network includes:

a first resitor coupled between a first circuit node and said first output of said input means;

a second resistor coupled in parallel with said first resistor; and a third resistor coupled between said first input of said differential amplifier means and said first circuit node.

5. The circuit according to claim 4 wherein said second resistive network includes:

a fourth resistor coupled between a second circuit node and said second output of said input means;

a fifth resistor coupled in parallel with said fourth resistor; and a sixth resistor coupled between said second input of said differential amplifier means and said second circuit node.

6. The circuit according to claim 3 wherein said first and second resistive networks are respectively first and second resistors.

7. An input stage of an operational amplifier responsive to first and second input voltages for providing an output signal, comprising:

input means for receiving said first and second input voltages and having first and second outputs;

differential amplifier means having first and second inputs for providing first and second currents at first and second outputs, said second output of said differential amplifier means being coupled for providing the output signal, said differential amplifier means including:

a first multi-collector transistor having a base, an emitter and first and second collectors, said base of said first multi-collector transistor being coupled to said first input of said differential amplifier means, said first collector of said first multi-collector transistor being coupled to said base of said first multi-collector transistor, said second collector of said first multi-collector transistor being coupled to said first output of said differential amplifier means;

a second multi-collector transistor having a base, an emitter and first and second collectors, said base of said second multi-collector transistor being coupled to said second input of said differential amplifier means, said first collector of said second multi-collector transistor being coupled to said base of said second multi-collector transistor, said second collector of said second multi-collector transistor being coupled to said second output of said differential amplifier means, said emitter of said second multi-collector transistor being coupled to said emitter of said first multi-collector transistor; and a current source coupled between a first supply voltage terminal and said emitters of said first and second multi-collector transistors;

a current mirror circuit having an input and an output, said input of said current mirror circuit being coupled to said first output of said differential amplifier means, said output of said current mirror circuit being coupled to said second output of said differential amplifier means;

a first adjustable resistive network coupled in series between said first output of said input means and said first input of said differential amplifier means; and a second adjustable resistive network coupled in series between said second output of said input means and said second input of said differential amplifier means, said first and second resistive networks being adjusted such that when said first and second input voltages are substantially equal the output signal is substantially equal to zero.

8. The circuit according to claim 7 wherein said differential amplifier means includes:

a first multi-collector transistor having a base, an emitter and first and second collectors, said base of said first multi-collector transistor being coupled to said first input of said differential amplifier means, said first collector of said first multi-collector transistor being coupled to said base of said first multi-collector transistor, said second collector of said first multi-collector transistor being coupled to said first output of said differential amplifier means;

a second multi-collector transistor having a base, an emitter and first and second collectors, said base of said second multi-collector transistor being coupled to said second input of said differential amplifier means, said first collector of said second multi-collector transistor being coupled to said base of said second multi-collector transistor, said second collector of said second multi-collector transistor being coupled to said second output of said differential amplifier means, said emitter of said second multi-collector transistor being coupled to said emitter of said first multi-collector transistor; and a current source coupled between a first supply voltage terminal and said emitters of said first and second multi-collector transistors.

9. The circuit according to claim 8 wherein said input means includes:

a first transistor having a collector, a base and an emitter, said collector of said first transistor being coupled to a second supply voltage terminal, said base of said first transistor being coupled to receive said first input voltage, and said emitter of said first transistor being coupled to said first output of said input means; and a second transistor having a collector, a base and an emitter, said collector of said second transistor being coupled to said second supply voltage terminal, said base of said second transistor being coupled to receive said second input voltage, and said emitter of said second transistor being coupled to said second output of said input means.

10. The circuit according to claim 9 wherein said current mirror circuit includes:

a first transistor having a collector, a base and an emitter, said collector of said first transistor of said current mirror circuit being coupled to said input of said current mirror circuit, said base of said first transistor of said current mirror circuit being coupled to said collector of said first transistor of said current mirror circuit, and said emitter of said first transistor of said current mirror circuit being coupled to said said second supply voltage terminal; and a second transistor having a collector, a base and an emitter, said collector of said second transistor of said current mirror circuit being coupled to said output of said current mirror circuit, said base of said second transistor of said current mirror circuit being coupled to said base of said first transistor of said current mirror circuit, and said emitter of said second transistor of said current mirror circuit being coupled to said second supply voltage terminal.

11. The circuit according to claim 10 wherein said first resistive network includes:

a first resistor coupled between a first circuit node and said first output of said input means;

a second resistor coupled in parallel with said first resistor; and a third resistor coupled between said first input of said differential amplifier means and said first circuit node.

12. The circuit according to claim 11 wherein said second resistive network includes:

a fourth resistor coupled between a second circuit node and said second output of said input means;

a fifth resistor coupled in parallel with said fourth resistor; and a sixth resistor coupled between said second input of said differential amplifier means and said second circuit node.

13. The circuit according to claim 10 wherein said first and second resistive networks are respectively first and second resistors.

14. A circuit, comprising:

input means for receiving first and second input voltages and having first and second outputs, said input means including:

a first transistor having a collector, a base and an emitter, said collector of said first transistor being coupled to a second supply voltage terminal, said base of said first transistor being coupled to receive said first input voltage, and said emitter of said first transistor being coupled to said first output of said input means; and a second transistor having a collector, a base and an emitter, said collector of said second transistor being coupled to said second supply voltage terminal, said base of said second transistor being coupled to receive said second input voltage, and said emitter of said second transistor being coupled to said second output of said input means;

differential amplifier means having first and second inputs and first and second outputs, said differential amplifier means including:

a first multi-collector transistor having a base, an emitter and first and second collectors, said base of said first multi-collector transistor being coupled to said first input of said differential amplifier means, said first collector of said first multi-collector transistor being coupled to said base of said first multi-collector transistor, said second collector of said first multi-collector transistor being coupled to said first output of said differential amplifier means;

a second multi-collector transistor having a base, an emitter and first and second collectors, said base of said second multi-collector transistor being coupled to said second input of said differential amplifier means, said first collector of said second multi-collector transistor being coupled to said base of said second multi-collector transistor, said second collector of said second multi-collector transistor being coupled to said second output of said differential amplifier means, said emitter of said second multi-collector transistor being coupled to said emitter of said first multi-collector transistor; and a current source coupled between a first supply voltage terminal and said emitters of said first and second multi-collector transistors;

a first adjustable resistive network coupled between said first output of said input means and said first input of said differential amplifier means, said first resistive network including:

a first resistor coupled between a first circuit node and said first output of said input means;

a second resistor coupled in parallel with said first resistor; and a third resistor coupled between said first input of said differential amplifier means and said first circuit node; and a second adjustable resistive network coupled between said second output of said input means and said second input of said differential amplifier means, said first and second resistive networks being adjusted such that when said first and second input voltages are substantially equal currents appearing at said first and second outputs of said differential amplifier means are substantially equal.

15. The circuit according to claim 14 wherein said second resistive network includes:

a fourth resistor coupled between a second circuit node and said second output of said input means;

a fifth resistor coupled in parallel with said fourth resistor; and a sixth resistor coupled between said second input of said differential amplifier means and said second circuit node.

16. An input stage of an operational amplifier responsive to first and second input voltages for providing an output signal, comprising:

input means for receiving said first and second input voltages and having first and second outputs, said input means including:

a first transistor having a collector, a base and an emitter, said collector of said first transistor being coupled to a second supply voltage terminal, said base of said first transistor being coupled to receive said first input voltage, and said emitter of said first transistor being coupled to said first output of said input means; and a second transistor having a collector, a base and an emitter, said collector of said second transistor being coupled to said second supply voltage terminal, said base of said second transistor being coupled to receive said second input voltage, and said emitter of said second transistor being coupled to said second output of said input means;

differential amplifier means having first and second inputs for providing first and second currents at first and second outputs, said second output of said differential amplifier means being coupled for providing the output signal, said differential amplifier means including:

a first multi-collector transistor having a base, an emitter and first and second collectors, said base of said first multi-collector transistor being coupled to said first input of said differential amplifier means, said first collector of said first multi-collector transistor being coupled to said base of said first multi-collector transistor, said second collector of said first multi-collector transistor being coupled to said first output of said differential amplifier means;

a second multi-collector transistor having a base, an emitter and first and second collectors, said base of said second multi-collector transistor being coupled to said second input of said differential amplifier means, said first collector of said second multi-collector transistor being coupled to said base of said second multi-collector transistor, said second collector of said second multi-collector transistor being coupled to said second output of said differential amplifier means, said emitter of said second multi-collector transistor being coupled to said emitter of said first multi-collector transistor; and a current source coupled between a first supply voltage terminal and said emitters of said first and second multi-collector transistors;

a current mirror circuit having an input and an output, said input of said current mirror circuit being coupled to said first output of said differential amplifier means, said output of said current mirror circuit being coupled to said second output of said differential amplifier means, said current mirror circuit including:

a first transistor having a collector, a base and an emitter, said collector of said first transistor of said current mirror circuit being coupled to said input of said current mirror circuit, said base of said first transistor of said current mirror circuit being coupled to said collector of said first transistor of said current mirror circuit, and said emitter of said first transistor of said current mirror circuit being coupled to said said second supply voltage terminal; and a second transistor having a collector, a base and an emitter, said collector of said second transistor of said current mirror circuit being coupled to said output of said current mirror circuit, said base of said second transistor of said current mirror circuit being coupled to said base of said first transistor of said current mirror circuit, and said emitter of said second transistor of said current mirror circuit being coupled to said second supply voltage terminal;

a first adjustable resistive network coupled between said first output of said input means and said first input of said differential amplifier means, said first resistive network includes:

a first resistor coupled between a first circuit node and said first output of said input means;

a second resistor coupled in parallel with said first resistor; and a third resistor coupled between said first input of said differential amplifier means and said first circuit node; and a second adjustable resistive network coupled between said second output of said input means and said second input of said differential amplifier means, said first and second resistive networks being adjusted such that when said first and second input voltages are substantially equal the output signal is substantially equal to zero.

17. The circuit according to claim 16 wherein said second resistive network includes:

a fourth resistor coupled between a second circuit node and said second output of said input means;

a fifth resistor coupled in parallel with said fourth resistor; and a sixth resistor coupled between said second input of said differential amplifier means and said second circuit node.

* * * * *

UNITED STATES PATENT AND TRADEMARK OFFICE
CERTIFICATE OF CORRECTION

PATENT NO.    : 5,132,559

DATED         : July 21, 1992

INVENTOR(S)   : Ira E. Baskett

It is certified that error appears in the above-identified patent and that said Letters Patent is hereby corrected as shown below:

In column 5, claim 3, line 44, please insert the word --first-- before the word transistor.

Signed and Sealed this

Fourth Day of January, 1994

Attest:

BRUCE LEHMAN

Attesting Officer    Commissioner of Patents and Trademarks